US012604580B2

(12) United States Patent
Yamashita

(10) Patent No.: US 12,604,580 B2
(45) Date of Patent: Apr. 14, 2026

(54) OPTICAL MEMBER, LIGHT-EMITTING DEVICE, METHOD FOR MANUFACTURING OPTICAL MEMBER, AND METHOD FOR MANUFACTURING LIGHT-EMITTING DEVICE

(71) Applicant: NICHIA CORPORATION, Anan (JP)

(72) Inventor: Toshiaki Yamashita, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 571 days.

(21) Appl. No.: 18/183,943

(22) Filed: Mar. 14, 2023

(65) Prior Publication Data

US 2023/0299248 A1     Sep. 21, 2023

(30) Foreign Application Priority Data

Mar. 16, 2022    (JP) ................................. 2022-040873

(51) Int. Cl.
H10H 20/856         (2025.01)
C04B 35/10         (2006.01)
(Continued)

(52) U.S. Cl.
CPC ........... H10H 20/856 (2025.01); C04B 35/10 (2013.01); H10H 20/8515 (2025.01);
(Continued)

(58) Field of Classification Search
CPC ............. H10H 20/856; H10H 20/8512; H10H 20/0361; H10H 20/8515; H10H 20/8511;

H10H 20/8581; H10H 20/8583; H10H 20/0365; C04B 2235/9646; C04B 2235/9653; C04B 2237/343; C04B 37/001; C04B 2235/3225; C04B 2235/764;
(Continued)

(56) References Cited

U.S. PATENT DOCUMENTS

2018/0006167 A1*   1/2018  Nomura ................ H10F 77/496
2018/0252372 A1*   9/2018  Noguchi ................ F21V 29/70
(Continued)

FOREIGN PATENT DOCUMENTS

JP        2018-002912 A      1/2018
JP        2019009406 A   *  1/2019   ............... G02B 5/00
(Continued)

*Primary Examiner* — Eliseo Ramos Feliciano
*Assistant Examiner* — Adam Joseph Mott
(74) *Attorney, Agent, or Firm* — Spencer Fane LLP

(57)         ABSTRACT
A method for manufacturing an optical member includes: preparing a first light-transmissive member and a first molded body made of an inorganic material and surrounding at least one or more lateral surfaces of the first light-transmissive member; firing the first molded body at a first temperature to obtain a first light-reflective member; bonding an upper surface of the first light-transmissive member to a lower surface of a second light-transmissive member; forming, on an upper surface of the first light-reflective member, a second molded body made of an inorganic material and surrounding at least one or more lateral surfaces of the second light-transmissive member; and firing the second molded body at a second temperature lower than the first temperature to obtain a second light-reflective member.

15 Claims, 11 Drawing Sheets

(51) Int. Cl.

| | |
|---|---|
| *H10H 20/851* | (2025.01) |
| *C04B 35/115* | (2006.01) |
| *C04B 38/00* | (2006.01) |
| *H10H 20/01* | (2025.01) |
| *H10H 20/855* | (2025.01) |
| *H10H 20/858* | (2025.01) |

(52) U.S. Cl.
CPC ........... *C04B 35/115* (2013.01); *C04B 38/007* (2013.01); *C04B 2235/3217* (2013.01); *C04B 2235/3225* (2013.01); *C04B 2235/764* (2013.01); *C04B 2235/9646* (2013.01); *C04B 2235/9653* (2013.01); *C04B 2237/343* (2013.01); *H10H 20/0361* (2025.01); *H10H 20/0363* (2025.01); *H10H 20/0365* (2025.01); *H10H 20/8511* (2025.01); *H10H 20/8512* (2025.01); *H10H 20/855* (2025.01); *H10H 20/8581* (2025.01); *H10H 20/8583* (2025.01)

(58) Field of Classification Search
CPC ........... C04B 2235/3217; C04B 35/64; C04B 2111/805; C04B 35/115; C04B 35/505; C04B 38/007
See application file for complete search history.

(56) References Cited

U.S. PATENT DOCUMENTS

| | | | | |
|---|---|---|---|---|
| 2019/0199052 A1* | 6/2019 | Miyoshi | ............... | H01S 5/02257 |
| 2020/0103095 A1* | 4/2020 | Sugimura | ........... | H01S 5/02257 |
| 2021/0332475 A1* | 10/2021 | Eboshi | .................... | C23C 16/01 |
| 2022/0010202 A1* | 1/2022 | Yamashita | ............ | C09K 11/02 |
| 2023/0118200 A1* | 4/2023 | Yamashita | ............ | H01S 5/0087 |
| | | | | 362/84 |
| 2024/0044475 A1* | 2/2024 | Kitajima | ............. | H01S 5/02208 |

FOREIGN PATENT DOCUMENTS

| | | | | | |
|---|---|---|---|---|---|
| JP | 2019117827 A | * | 7/2019 | | |
| JP | 2021124536 A | * | 8/2021 | | |
| JP | 2022071260 A | * | 5/2022 | | |
| WO | WO-2019069871 A1 | * | 4/2019 | ............... | G02B 5/08 |

* cited by examiner

OPTICAL MEMBER, LIGHT-EMITTING DEVICE, METHOD FOR MANUFACTURING OPTICAL MEMBER, AND METHOD FOR MANUFACTURING LIGHT-EMITTING DEVICE

CROSS-REFERENCE TO RELATED APPLICATION

The present application claims priority to Japanese Patent Application No. 2022-040873, filed on Mar. 16, 2022, the disclosure of which is hereby incorporated herein by reference in its entirety.

BACKGROUND

The present disclosure relates to an optical member, a light-emitting device, a manufacturing method of the optical member and a manufacturing method of the light-emitting device.

Japanese Patent Application Laid-open Publication No. 2018-002912 discloses a sintered compact having a wavelength conversion area including a phosphor material and a holding area including a ceramic material. In order to favorably conduct heat generated in the wavelength conversion area, the holding area has a higher thermal conductivity than the wavelength conversion area.

SUMMARY

When only one type of light-transmissive member or light-reflective member is used, and for example, one of the characteristics in a trade-off relationship such as heat dissipation and light reflectivity in the light-reflective member is given priority in design, the other characteristics may not be sufficient.

The present disclosure includes the following embodiments. A method for manufacturing an optical member includes: preparing a first light-transmissive member and a first molded body, the first light-transmissive member having an upper surface, a lower surface, and one or more lateral surfaces, and the first molded body being made of an inorganic material and surrounding at least the one or more lateral surfaces of the first light-transmissive member; firing the first molded body at a first temperature to obtain a first light-reflective member so that the first light-reflective member surrounds the one or more lateral surfaces of the first light-transmissive member with the upper surface and the lower surface of the first light-transmissive member being exposed from the first light-reflective member; bonding the upper surface of the first light-transmissive member to a lower surface of a second light-transmissive member, the second light-transmissive member having an upper surface, the lower surface, and one or more lateral surfaces; forming, on an upper surface of the first light-reflective member, a second molded body surrounding at least the one or more lateral surfaces of the second light-transmissive member and made of an inorganic material; and firing the second molded body at a second temperature lower than the first temperature to obtain a second light-reflective member so that the second light-reflective member surrounds the one or more lateral surfaces of the second light-transmissive member with the upper surface of the second light-transmissive member being exposed from the second light-reflective member.

A method for manufacturing an optical member includes: preparing a first light-transmissive member and a first molded body, the first light-transmissive member having an upper surface, a lower surface, and one or more lateral surfaces, and a first molded body being made of an inorganic material and surrounding at least the one or more lateral surfaces of the first light-transmissive member; firing the first molded body at a first temperature to obtain a first light-reflective member so that the first light-reflective member surrounds the one or more lateral surfaces of the first light-transmissive member with the upper surface and the lower surface of the first light-transmissive member being exposed from the first light-reflective member; forming a second molded body made of an inorganic material on an upper surface of the first light-reflective member; firing the second molded body at a second temperature lower than the first temperature to obtain a second light-reflective member defining an opening at which the upper surface of the first light-transmissive member is exposed; and forming a second light-transmissive member in the opening of the second light-reflective member.

A method for manufacturing a light-emitting device includes manufacturing the optical member by any one of the methods described above, and positioning the optical member and a light-emitting element so that light emitted by the light-emitting element is incident on the first light-transmissive member of the optical member.

An optical member includes a first light-reflective member, a first light-transmissive member, a second light-reflective member, and a second light-reflective member. The first light-reflective member is made of ceramics having a plurality of voids. The first light-transmissive member has an upper surface, a lower surface, and one or more lateral surfaces. The one or more lateral surfaces are surrounded by the first light-reflective member with the upper surface and the lower surface being exposed from the first light-reflective member. The second light-reflective member is made of ceramics having a plurality of voids, and has a porosity higher than a porosity of the first light-reflective member. The second light-transmissive member has an upper surface, a lower surface and one or more lateral surfaces. The one or more lateral surfaces are surrounded by the second light-reflective member with the upper surface and the lower surface which are exposed from the second light-reflective member. The second light-transmissive member is fixed to the upper surface of the first light-transmissive member.

A light-emitting device includes the optical member described above and a light-emitting element configured to emit light. The optical member and the light-emitting element are positioned so that the light emitted by the light-emitting element is incident on the first light-transmissive member of the optical member.

According to the manufacturing method of the optical member and the manufacturing method of the light-emitting device described above, the optical member including the first light-transmissive member, the second light-transmissive member, the first light-reflective member, and the second light-reflective member, and the light-emitting device including the same can be easily manufactured. According to the optical member and the light-emitting device described above, heat dissipation and visibility of light can be improved.

DETAILED DESCRIPTION

Figure 1A:
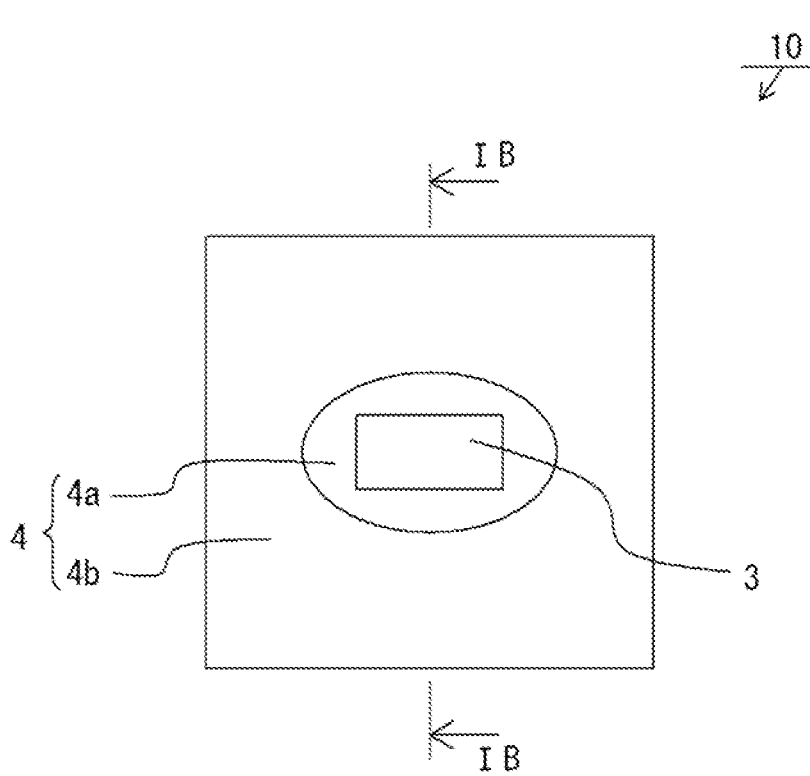
FIG. 1A is a schematic top view of an optical member according to a first embodiment.

Embodiments of the present invention are described below with reference to the drawings as appropriate. However, the embodiments to be described below are intended to embody the technical idea of the present invention, and the present invention is not limited to the following unless otherwise specified. The size, positional relationship, and the like of members illustrated in the drawings may be exaggerated for clarity of description.

First Embodiment

Figure 1B:
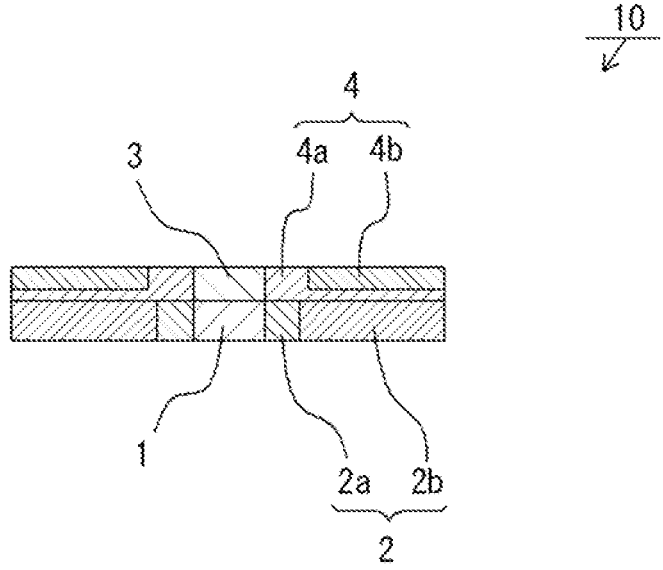
FIG. 1B is a cross-sectional view taken along line IB-IB in FIG. 1A.
Figure 1C:
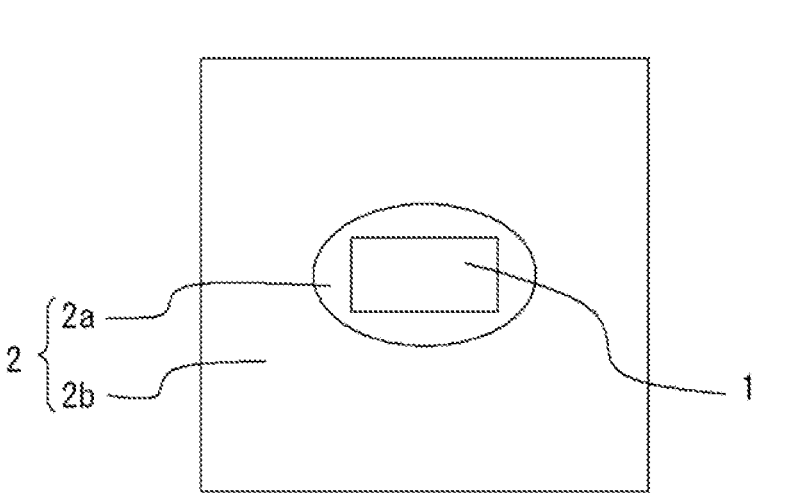
FIG. 1C is a schematic bottom view of the optical member according to the first embodiment.

An optical member 10 according to a first embodiment is described with reference to FIGS. 1A to 1C. Furthermore, a manufacturing method of the optical member 10 according to the first embodiment is described with reference to FIGS. 2 to 11. FIG. 1A is a top view of the optical member 10 according to the first embodiment. FIG. 1B is a cross-sectional view taken along line IB-IB in FIG. 1A. FIG. 1C is a bottom view of the optical member 10 according to the first embodiment. FIGS. 2 to 11 are schematic views for illustrating the manufacturing method of the optical member 10 according to the first embodiment.

Optical Member 10

The optical member 10 includes a first light-transmissive member 1, a first light-reflective member 2, a second light-transmissive member 3, and a second light-reflective member 4. The first light-transmissive member 1 includes one or more lateral surfaces surrounded by the first light-reflective member 2 and an upper surface and a lower surface exposed from the first light-reflective member 2. The second light-transmissive member 3 includes one or more lateral surfaces surrounded by the second light-reflective member 4 and an upper surface and a lower surface exposed from the second light-reflective member 4. The second light-transmissive member 3 is fixed to the upper surface of the first light-transmissive member 1. The first light-reflective member 2 and the second light-reflective member 4 are each made of ceramics including a plurality of voids. A porosity of the second light-reflective member 4 is higher than a porosity of the first light-reflective member 2. Note that in FIG. 1B, a surface on an upper side is defined as an upper surface, and a surface on a lower side is defined as a lower surface, but the vertical positional relationship is not limited to the above in actual use.

Since the porosity of the second light-reflective member 4 is higher than the porosity of the first light-reflective member 2, the first light-reflective member 2 can be a member having excellent heat dissipation, and the second light-reflective member 4 can be a member having excellent light reflectivity. As a result, when the lower surface of the first light-transmissive member 1 is located on a light incident side, and the upper surface of the second light-transmissive member 3 is located on a light exit side, the heat dissipation when the first light-transmissive member 1 generates heat due to light irradiation can be improved and the visibility of light, when observed from the light exit side, can be improved.

As illustrated in FIGS. 1B and 1C, the first light-reflective member 2 may include a first region 2a in the vicinity of the first light-transmissive member 1 and may include a second region 2b outside the first region 2a. A porosity of the first region 2a is higher than a porosity of the second region 2b. As illustrated in FIGS. 1A and 1B, the second light-reflective member 4 may include a third region 4a in the vicinity of the second light-transmissive member 3 and may include a fourth region 4b outside the third region 4a. A porosity of the third region 4a is higher than a porosity of the fourth region 4b. In this case, since the porosity of the third region 4a is higher than the porosity of the first region 2a, it may be said that the porosity of the second light-reflective member 4 is higher than the porosity of the first light-reflective member 2. Alternatively, since an average value of the porosity of the third region 4a and the porosity of the fourth region 4b is higher than an average value of the porosity of the first region 2a and the porosity of the second region 2b, it may be said that the porosity of the second light-reflective member 4 is higher than the porosity of the first light-reflective member 2. Alternatively, when the porosity of the first region 2a and the porosity of the third region 4a are equivalent to each other, and the porosity of the second region 2b and the porosity of the fourth region 4b are equivalent to each other, since the volume of the third region 4a is greater than the volume of the first region 2a, it may be said that the porosity of the second light-reflective member 4 is higher than the porosity of the first light-reflective member 2. For example, it can be seen, from observation of the upper surface, the cross-section, and the lower surface as illustrated in FIGS. 1A to 1C, that the volume of the third region 4a is greater than the volume of the first region 2a. As illustrated in FIGS. 1A and 1B, the third region 4a may be provided in the vicinity of the first light-reflective member 2. This can increase the probability that light from the first light-reflective member 2 is reflected by the second light-reflective member 4, and can reduce light that leaks from the upper surface and the one or more lateral surfaces of the second light-reflective member 4.

The first light-reflective member 2 may not include the first region 2a and the second region 2b. The second light-reflective member 4 may not include the third region 4a and the fourth region 4b. When there is no deviation in the porosity of the first light-reflective member 2, a porosity of any portion may be used as the porosity of the first light-reflective member 2. When there is no deviation in the porosity of the second light-reflective member 4, a porosity of any portion may be used as the porosity of the second light-reflective member 4.

The porosity can be calculated using images taken with a scanning electron microscope (SEM). For example, the magnitude of the porosity can be compared by taking an SEM image of a cross-section cut in a direction connecting the upper surface and the lower surface of the optical member 10 as illustrated in FIG. 1B and comparing the number of voids in a 100 μm square range. The porosity may be defined as the ratio of the area occupied by the voids in the 100 μm square range of the cross-sectional SEM image.

First Light-Transmissive Member 1

The first light-transmissive member 1 is made of a material through which light from a light-emitting element or the like passes. The first light-transmissive member 1 may contain a phosphor. Since the phosphor scatters light in the first light-transmissive member 1, the light density of light incident on the second light-transmissive member 3 can be reduced. As a result, when the second light-transmissive member 3 contains a phosphor, the luminous efficiency of the phosphor of the second light-transmissive member 3 can be improved. As the first light-transmissive member 1, a material that does not melt at the firing temperature of the first light-reflective member 2 can be used. In the present embodiment, ceramics containing a phosphor (hereinafter, referred to as "phosphor ceramics") is used as the first light-transmissive member 1. The first light-transmissive member 1 may be ceramics essentially made of only a phosphor, or may be a single crystal of a phosphor.

The first light-transmissive member 1 and the first light-reflective member 2 are in contact with each other. That is, the first light-transmissive member 1 and the first light-reflective member 2 are in direct contact with each other without interposing another member. This reduces the amount of light absorbed by another member, thereby improving light extraction efficiency. Another light-transmissive member may be interposed between the first light-transmissive member 1 and the first light-reflective member 2. When the first light-transmissive member 1 contains a phosphor, another member may be interposed to protect the phosphor of the first light-transmissive member 1 from heat when the first light-reflective member 2 is fired.

The phosphor ceramics including a phosphor and a binder made of an inorganic material can be used. Specifically, an yttrium aluminum garnet (YAG)-based phosphor is used as the phosphor and aluminum oxide is used as the binder. Furthermore, a material including aluminum oxide as a main component is used as the first light-reflective member 2. In this way, when the binder included in the first light-transmissive member 1 includes the same material as the first light-reflective member 2, an adhesion force between the first light-transmissive member 1 and the first light-reflective member 2 can be increased.

As the phosphor, a phosphor having a linear expansion coefficient close to a linear expansion coefficient of the first light-reflective member 2 is preferably used to increase the adhesion force between the first light-transmissive member 1 and the first light-reflective member 2. When a material including aluminum oxide as a main component is used as the first light-reflective member 2, examples of phosphors having a linear expansion coefficient close to the linear expansion coefficient of the first light-reflective member 2 include YAG-based phosphors. The YAG-based phosphors in which at least a part of Y is replaced with Tb (TAG), or in which at least a part of Y is replaced with Lu (LAG) may be used. The YAG-based phosphor may also include Gd, Ga, or the like in its composition. When the YAG-based phosphor is used as the phosphor, and aluminum oxide is used for the first light-reflective member 2, for the same or similar reason, the binder included in the first light-transmissive member 1 is preferably aluminum oxide. In addition, as the binder, for example, YAG including no activator and yttrium oxide can also be used. The use of these suppresses a decrease in the luminous efficiency of the phosphor due to heat during firing of the first light-reflective member 2.

The first light-transmissive member 1 has a quadrangular prism shape, and its upper surface is rectangular that is elongated in one direction. The first light-transmissive member 1 may have a cylindrical shape, a polygonal prism shape, a polygonal pyramid shape, or a truncated cone shape.

The first light-transmissive member 1 may contain no phosphor. The first light-transmissive member 1 may be sapphire, magnesia, quartz, or the like.

The first light-transmissive member 1 may include a first phosphor, and the second light-transmissive member 3 may include a second phosphor. The second phosphor is a phosphor different from the first phosphor. For example, by using a yellow phosphor as the first phosphor and using a red phosphor as the second phosphor, color rendering properties can be improved. When only the first light-transmissive member 1 contains a phosphor, the scattering of light in the second light-transmissive member 3 is reduced, so that the visibility of light can be improved. When only the second light-transmissive member 3 contains a phosphor, heat of the second light-transmissive member 3 can be dissipated by the first light-transmissive member 1, thus increasing light output at which the phosphor contained in the second light-transmissive member 3 reaches thermal saturation.

First Light-Reflective Member 2

The first light-reflective member 2 is provided on the side of the first light-transmissive member 1 so as to surround the first light-transmissive member 1. In other words, the first light-reflective member 2 is provided with a through hole penetrating in the vertical direction, and the first light-transmissive member 1 is provided inside the through hole. The upper surface of the first light-transmissive member 1 and the lower surface of the first light-transmissive member 1 are exposed from the first light-reflective member 2.

The first light-reflective member 2 is made of ceramics including a plurality of voids. In one cross-section across the first light-transmissive member 1 and the first light-reflective member 2, the plurality of voids are unevenly distributed in the vicinity of the first light-transmissive member 1. That is, the first region 2a having a first porosity and the second region 2b having a second porosity lower than the first porosity are provided in order of proximity to the first light-transmissive member 1. By providing the first region 2a in contact with the first light-transmissive member 1, light can be efficiently reflected in the vicinity of the first light-transmissive member 1. Providing the second region 2b outside the first region 2a improves the strength and heat dissipation. The first region 2a and the second region 2b are in the same member and have the same composition. As a result, peeling between the first region 2a and the second region 2b can be made less likely to occur than when different members are bonded together.

A width of the first region 2a can be set in a range from 30 μm to 200 μm, and may be set in a range from 50 μm to 150 μm. Light passing through the first region 2a can be reduced by setting the width to 30 μm or more. The distance to the second region 2b having a relatively high heat dissipation can be shortened by setting the width to 200 μm or less, thereby improving heat dissipation.

The width of the first region 2a may be constant or may vary. As illustrated in FIG. 1B, the first region 2a is preferably disposed from an upper end to a lower end of the lateral surfaces of the first light-transmissive member 1. As a result, light transmission across the entire lateral surfaces of the first light-transmissive member 1 can be reduced.

Examples of the first light-reflective member 2 include oxide such as aluminum oxide, silicon oxide, magnesium oxide, yttrium oxide, zirconium oxide, tantalum oxide, niobium oxide, titanium oxide, lutetium oxide, or lanthanum oxide, oxynitride such as aluminum oxynitride or silicon oxynitride, nitride such as aluminum nitride or silicon nitride, and a composite member thereof. The first light-reflective member 2 based on aluminum oxide having high thermal conductivity, low light absorption, and good sinterability is preferably used. When the aluminum oxide is used as a base, one or more of silicon oxide, magnesium oxide, or yttrium oxide may be added. Furthermore, the aluminum oxide may be combined with a high refractive index material such as zirconium oxide. When the aluminum oxide is used as a base, by adding a material different from the aluminum oxide, the growth of particles of the aluminum oxide can be suppressed. Since the number of grain boundaries increases due to particle growth suppression, a reduction in the size of voids and an increase in the number of voids can be expected, and thus an improvement in reflectivity is expected.

Second Light-Transmissive Member 3

The second light-transmissive member 3 is made of a material through which light from a light-emitting element, the first light-transmissive member 1, or the like passes. As the second light-transmissive member 3, phosphor ceramics, ceramics essentially made only of a phosphor, a single crystal phosphor, sapphire, magnesia, quartz, glass, or the like can be used. The second light-transmissive member 3 may be glass containing a phosphor (hereinafter, referred to as "phosphor glass"). When ceramics essentially made only of a phosphor or a single crystal phosphor is used for the second light-transmissive member 3, the amount of light scattered is decreased, thereby improving the visibility of light. When phosphor glass is used for the second light-transmissive member 3, the second light-transmissive member 3 can be fixed to the first light-transmissive member 1 without using an adhesive, thereby improving luminous efficiency. The second light-transmissive member 3 may contain a light diffusing material other than a phosphor.

The lower surface of the second light-transmissive member 3 is in contact with a part or all of the upper surface of the first light-transmissive member 1, and the upper surface of the second light-transmissive member 3 is exposed from the second light-reflective member 4. The lower surface of the second light-transmissive member 3 may be in contact with a part of the upper surface of the first light-reflective member 2. The size of the lower surface of the second light-transmissive member 3 may be made greater than the size of the upper surface of the first light-transmissive member 1 so that the lower surface of the second light-transmissive member 3 is in contact with the entire upper surface of the first light-transmissive member 1 and is in contact with a part of the upper surface of the first light-reflective member 2. As a result, the entire upper surface of the first light-transmissive member 1 can be more reliably connected to the lower surface of the second light-transmissive member 3.

The second light-transmissive member 3 and the second light-reflective member 4 are in contact with each other. That is, the second light-transmissive member 3 and the second light-reflective member 4 are in direct contact with each other without interposing another member. This reduces the amount of light absorbed by another member, thereby improving light extraction efficiency. Another light-transmissive member may be interposed between the second light-transmissive member 3 and the second light-reflective member 4. When the second light-transmissive member 3 contains a phosphor, another member may be interposed to protect the phosphor of the second light-transmissive member 3 from heat when the second light-reflective member 4 is fired. When the second light-transmissive member 3 side is a light-emitting surface, fluorescence of light extracted from the second light-transmissive member 3 tends to be relatively strong at its outer peripheral portion, but by providing another light-transmissive member, light seeps into another member, and thus a reduction in color unevenness is expected.

When the first light-transmissive member 1 contains a phosphor, the phosphor contained in the second light-transmissive member 3 is preferably a phosphor that emits fluorescence of a color different from that of the phosphor contained in the first light-transmissive member 1. As a result, color rendering properties when the optical member 10 is irradiated with light can be improved. When the first light-transmissive member 1 contains a YAG-based phosphor, for example, a nitrogen-containing calcium aluminosilicate (CaO—Al$_2$O$_3$—SiO$_2$)-based phosphor activated with europium and/or chromium, a europium-activated silicate ((Sr, Ba)$_2$SiO$_4$)-based phosphor, an α-sialon phosphor, a β-sialon phosphor, and the like can be used.

The second light-transmissive member 3 is a quadrangular prism, and its upper surface is rectangular elongated in one direction. The second light-transmissive member 3 may have a cylindrical shape, a polygonal prism shape, a polygonal pyramid shape, or a truncated cone shape.

Second Light-reflective Member 4

The second light-reflective member 4 surrounds the second light-transmissive member 3, and is provided on the second light-transmissive member 3 side of the first light-reflective member 2. In other words, the second light-reflective member 4 is formed with an opening on the opposite side of the first light-reflective member 2 from the second light-transmissive member 3, and the second light-transmissive member 3 is provided inside the opening. The second light-reflective member 4 is in contact with the first light-reflective member 2. An adhesive may be provided between the second light-reflective member 4 and the first light-reflective member 2.

The second light-reflective member 4 is made of ceramics including a plurality of voids. The second light-reflective member 4 can be provided with a third region 4a and a fourth region 4b. The third region 4a has a third porosity, and the fourth region 4b has a fourth porosity lower than the third porosity. The third region 4a and the first region 2a can have the same or similar structure, can be formed by a similar manufacturing method, and can obtain a similar effect. The fourth region 4b and the second region 2b can have the same or similar structure, can be formed by a similar manufacturing method, and can obtain a similar effect. The third region 4a and the fourth region 4b are in the same member and have the same composition. As a result, peeling between the third region 4a and the fourth region 4b can be made less likely to occur than when different members are bonded together.

In the top view or the bottom view illustrated in FIGS. 1A and 1C, a width of the third region 4a may be greater than a width of the first region 2a. Thus, light from the second light-transmissive member 3 can be more efficiently reflected in the third region 4a. As illustrated in FIG. 1B, the third region 4a may also be formed in the vicinity of the first light-reflective member 2. When the third region 4a is located in the vicinity of the first light-reflective member 2, light directed upward from the first light-reflective member 2 can be reflected in the third region 4a, thereby further improving the visibility of the light.

Examples of the second light-reflective member 4 include oxide such as aluminum oxide, silicon oxide, magnesium oxide, yttrium oxide, zirconium oxide, tantalum oxide, niobium oxide, titanium oxide, lutetium oxide, or lanthanum oxide, oxynitride such as aluminum oxynitride or silicon oxynitride, nitride such as aluminum nitride or silicon nitride, and a composite member thereof. The second light-reflective member 4 based on aluminum oxide having high thermal conductivity, low light absorption, and good sinterability is preferably used. When the aluminum oxide is used as a base, one or more of silicon oxide, magnesium oxide, or yttrium oxide may be added. Furthermore, the aluminum oxide may be combined with a high refractive index material such as zirconium oxide. When the aluminum oxide is used as a base, by adding a material different from the aluminum oxide, the growth of particles of the aluminum oxide can be suppressed. Since the number of grain boundaries increases due to particle growth suppression, a reduction in the size of voids and an increase in the number of voids can be expected, and thus an improvement in reflectivity is expected.

The second light-reflective member 4 may be formed using the same material as the first light-reflective member 2, or may be formed using a different material. When both the second light-reflective member 4 and the first light-reflective member 2 are made of ceramics, a first light reflecting powder made of an inorganic material is used to form the first light-reflective member 2, and a second light reflecting powder made of an inorganic material is used to form the second light-reflective member 4. In this case, as the second light reflecting powder, a powder having an average particle size greater than an average particle size of the first light reflecting powder may be used. Furthermore, a material having a high firing temperature may be blended more in the second light-reflective member 4 than in the first light-reflective member 2. By adopting one or more of the first light reflecting powder or the second light reflecting powder, a second light-reflective member having a higher porosity than the first light-reflective member 2 can be produced even though a second temperature is not made higher than a first temperature.

Manufacturing Method of Optical Member 10

A manufacturing method of the optical member 10 includes a step of preparing the first light-transmissive member 1 and a first molded body, a step of producing the first light-reflective member 2, a step of bonding the second light-transmissive member 3 to the first light-transmissive member 1, a step of forming a second molded body, and a step of producing the second light-reflective member 4.

The step of preparing the first light-transmissive member 1 and the first molded body includes preparing the first light-transmissive member 1 including the upper surface, the lower surface, and the one or more lateral surfaces, and the first molded body surrounding at least the one or more lateral surfaces of the first light-transmissive member 1 and made of an inorganic material. The step of producing the first light-reflective member 2 includes firing the first molded body at the first temperature to produce the first light-reflective member 2 by which the one or more lateral surfaces of the first light-transmissive member 1 is surrounded and from which the upper surface and the lower surface of the first light-transmissive member are exposed. The step of bonding the second light-transmissive member 3 to the first light-transmissive member 1 includes bonding, to the upper surface of the first light-transmissive member 1, the lower surface of the second light-transmissive member 3 having the upper surface, the lower surface, and the one or more lateral surfaces. The step of forming the second molded body includes forming, on the upper surface of the first light-reflective member 2, the second molded body surrounding at least the one or more lateral surfaces of the second light-transmissive member 3 and made of an inorganic material. The step of producing the second light-reflective member 4 includes firing the second molded body at the second temperature lower than the first temperature to produce the second light-reflective member 4 by which the one or more lateral surfaces of the second light-transmissive member 3 is surrounded and from which the upper surface of the second light-transmissive member 3 is exposed.

As a result, the optical member 10 including the first light-transmissive member 1, the second light-transmissive member 3, the first light-reflective member 2, and the second light-reflective member 4 can be easily produced.

By producing the second light-reflective member 4 at the second temperature lower than the first temperature at which the first light-reflective member 2 is produced, a material unusable for the first light-transmissive member 1 due to degradation at the first temperature can be used for the second light-transmissive member 3. For example, glass can be used for the second light-transmissive member 3. Furthermore, for example, a phosphor which cannot be contained in the first light-transmissive member 1 can be contained in the second light-transmissive member 3. The first light-transmissive member 1 and the second light-transmissive member 3 may contain different types of phosphors, which can improve color rendering properties when the optical member 10 is irradiated with light.

When both the first light-reflective member 2 and the second light-reflective member 4 are ceramics, it is preferable to produce the second light-reflective member 4 at the second temperature lower than the first temperature at which the first light-reflective member 2 is produced. As a result, the first light-reflective member 2 can have excellent heat dissipation, and the second light-reflective member 4 can have excellent light reflectivity. Consequently, when the lower surface of the first light-transmissive member 1 is located on a light incident side, and the upper surface of the second light-transmissive member 3 is located on a light exit side, the heat dissipation when the first light-transmissive member 1 generates heat due to light irradiation can be improved and the visibility of light, when observed from the light exit side, can be improved.

Each step included in the manufacturing method of the optical member 10 is described below. Here, members with the same name and the same reference numerals indicate the same members or members of the same quality, and redundant description thereof is omitted as appropriate.

Step of Preparing First Light-Transmissive Member 1 and First Molded Body

The first light-transmissive member 1 and the first molded body are prepared. The first light-transmissive member 1 includes the upper surface, the lower surface, and the one or more lateral surfaces. In the present embodiment, a plurality of first light-transmissive members 1 are prepared. As a result, a plurality of optical members 10 can be produced in one-time manufacturing, thereby improving mass productivity. The first molded body surrounds at least the one or more lateral surfaces of the first light-transmissive member 1. The first molded body is made of an inorganic material. In the present embodiment, the first molded body is formed by a slip casting method (slurry casting method). By using the slip casting method, the first molded body can be formed without applying pressure. Furthermore, the amount of organic matter included in a slurry can be reduced as compared with a case using a doctor blade method. As a result, the molding density can be increased, thereby reducing the possibility of cracks occurring in a first fired body produced by firing the first molded body.

Figure 2:
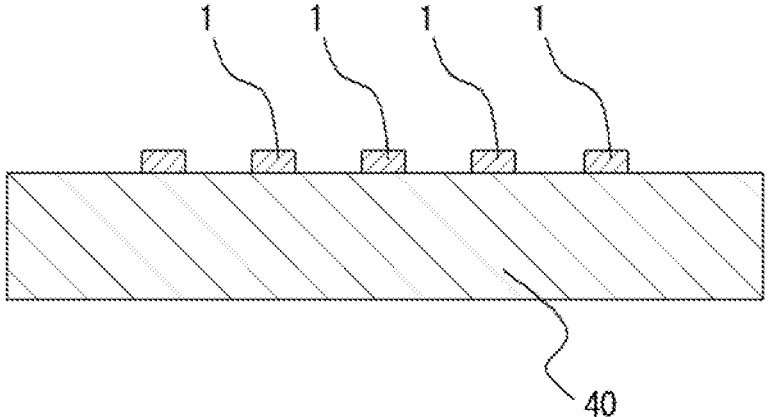
FIG. 2 is a schematic view for illustrating a manufacturing method of the optical member according to the first embodiment.

First, as illustrated in FIG. 2, the first light-transmissive member 1 is temporarily fixed to a support member 40. As a result, in the step of forming the first molded body 2d, overturning of the first light-transmissive member 1 can be suppressed. Furthermore, the distance between adjacent first light-transmissive members 1 can be kept constant. The support member 40 may not be used, and the temporary fixing may not be performed. When the first molded body 2d is formed by the slip casting method, gypsum, for example, is used as the support member 40. As the support member 40, ceramics with a relatively low density such as porous alumina ceramics may be used. Such ceramics with a relatively low density has, for example, a density lower than the density of the first region 2a of the first light-reflective member 2 produced.

Figure 3:
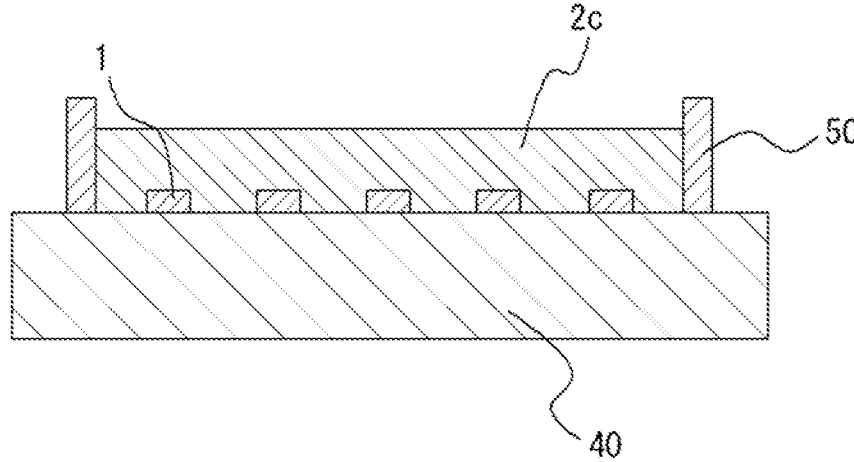
FIG. 3 is a schematic view for illustrating the manufacturing method of the optical member according to the first embodiment.

Subsequently, as illustrated in FIG. 3, after disposing a frame body 50 surrounding the plurality of first light-transmissive members 1 on an upper surface of the support member 40, a slurry 2c including the first light reflecting powder is applied to an inner side of the frame body 50. Subsequently, moisture contained in the slurry 2c is absorbed by the support member 40 which is gypsum. The gypsum is a material that absorbs moisture, so it is simply left at room temperature for several hours, for example. As a result, the slurry 2c becomes the first molded body 2d including the first light reflecting powder. The slurry 2c includes, for example, the first light reflecting powder containing aluminum oxide and yttrium oxide, a dispersant, a binder, and pure water. As the frame 50, for example, a frame made of fluororesin is used.

Figure 4:
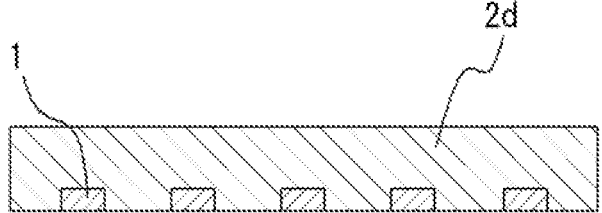
FIG. 4 is a schematic view for illustrating the manufacturing method of the optical member according to the first embodiment.

Subsequently, as illustrated in FIG. 4, the support member 40 and the frame body 50 are removed from the first light-transmissive member 1 and the first molded body 2d. The first molded body 2d is preferably formed to surround at least one of the upper surface or the lower surface of the first light-transmissive member 1 and the lateral surfaces thereof. As a result, the lateral surfaces of the first light-transmissive member 1 can be reliably covered. The first molded body 2d surrounds, for example, the upper surface and the lateral surfaces of the first light-transmissive member 1. The first molded body 2d may surround the lower surface and the lateral surfaces of the first light-transmissive member 1, or may surround the upper surface, the lower surface, and the lateral surfaces of the first light-transmissive member 1.

The first molded body 2d can be molded using a slip casting method, a doctor blade method (sheet molding method), a dry molding method, or the like. When the doctor blade method is used, specifically, a slurry mixed with an additive to cover the first light-transmissive member 1 is applied in a sheet shape, and then the green sheet coated with the slurry in the sheet shape can be dried to form the first molded body 2d. When the dry molding method is used, specifically, the first molded body 2d can be formed by filling a container with the first light reflecting powder made of an inorganic material so as to cover the first light-transmissive member 1 and pressing the first light reflecting powder. When ceramics is produced by the first molded body 2d, the first molded body 2d includes the first light reflecting powder made of an inorganic material. The material produced by the first molded body 2d may not be ceramics, and in such a case, the first molded body 2d may not contain the first light reflecting powder made of an inorganic material.

Step of Producing First Light-Reflective Member 2

The first molded body 2d is fired at the first temperature to produce the first light-reflective member 2 by which the one or more lateral surfaces of the first light-transmissive member 1 is surrounded and from which the upper surface and the lower surface thereof are exposed.

A degreasing step of heating the first molded body 2d at a temperature lower than the first temperature may be performed before firing the first molded body 2d at the first temperature. The degreasing step can be performed, for example, in a nitrogen atmosphere or an air atmosphere.

Figure 5:
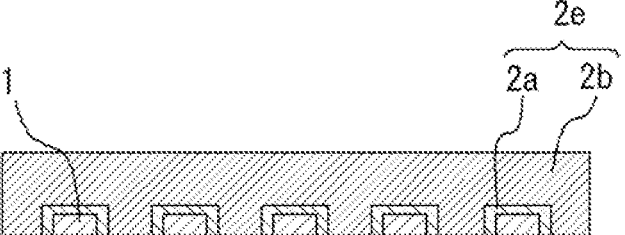
FIG. 5 is a schematic view for illustrating the manufacturing method of the optical member according to the first embodiment.

A first fired body 2e is produced as illustrated in FIG. 5 by firing the first molded body 2d at the first temperature. The first fired body 2e may include the first region 2a and the second region 2b. In order to produce such a first fired body 2e, the firing temperature, the firing time, and the degree of pressure during firing may be adjusted. It is preferable to fire the first molded body 2d without pressing. As a result, as a first composite body in which the first fired body 2e and the first light-transmissive member 1 are integrated, a first composite body including the first fired body 2e having the first region 2a and the second region 2b in order from the first light-transmissive member 1 side can be produced. It is assumed that the reason why the first region 2a and the second region 2b are formed is that the first light-transmissive member 1 hinders the bonding of the first light reflecting powders in the vicinity of the first light-transmissive member 1 and thus voids are likely to occur. It is assumed that by firing the first molded body 2d without pressing, the firing is completed while the first light reflecting powders are kept separated from each other in this way, and thus a porosity of the first fired body 2e increases in the vicinity of the first light-transmissive member 1. When the first fired body 2e is ceramics, the first fired body 2e may be referred to as a first sintered compact. The first sintered compact is produced by sintering the first molded body 2d at the first temperature.

When aluminum oxide is used as the first light reflecting powder, the first temperature is preferably set in a range from 1200° C. to 1700° C., and more preferably set in a range from 1300° C. to 1500° C. By setting the first temperature to 1200° C. or higher, the strength of the first light-reflective member 2 produced can be ensured. By setting the first temperature to 1700° C. or lower, the growth of particles can be suppressed, thereby reducing the possibility that the transmissivity of the first light-reflective member 2 increases due to an increase in density. Furthermore, when the first light-transmissive member 1 contains a phosphor, degradation of the phosphor can be suppressed by setting the first temperature to 1700° C. or lower. The first temperature indicates the ambient temperature during firing.

In the present embodiment, firing is performed in the air atmosphere. The firing time can be set in a range from 30 minutes to 10 hours, for example, and is preferably set in a range from 3 hours to 6 hours. When the firing time is 30 minutes or more, the strength of the first fired body 2e can be easily ensured. Furthermore, by setting the firing time to 10 hours or less, it is possible to avoid spending more time on firing than necessary.

Figure 6:
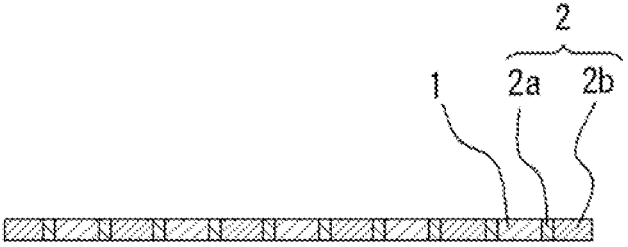
FIG. 6 is a schematic view for illustrating the manufacturing method of the optical member according to the first embodiment.

When the first fired body 2e surrounds at least one of the upper surface or the lower surface of the first light-transmissive member 1 as illustrated in FIG. 5, a part of the first fired body 2e produced by firing the first molded body 2d is removed so that the upper surface and the lower surface of the first light-transmissive member 1 are exposed. As a result, as illustrated in FIG. 6, the first light-reflective member 2 by which the lateral surfaces of the first light-transmissive member 1 is surrounded and from which the upper surface and the lower surface thereof are exposed is produced. When the first fired body 2e does not surround both the upper surface and the lower surface of the first light-transmissive member 1, the first fired body 2e may be used as the first light-reflective member 2.

Examples of the method of removing a part of the first fired body 2e include polishing or the like. In the present embodiment, a part of the first fired body 2e is removed only from one side, but may be removed from both sides. Polishing or the like may be used to mirror-finish the upper surface and/or the lower surface of the first light-transmissive member 1. The upper surface and/or the lower surface of the first light-transmissive member 1 may be roughened by polishing or the like so as to scatter light.

Step of Bonding Second Light-transmissive Member 3 to First Light-transmissive Member 1

Figure 7:
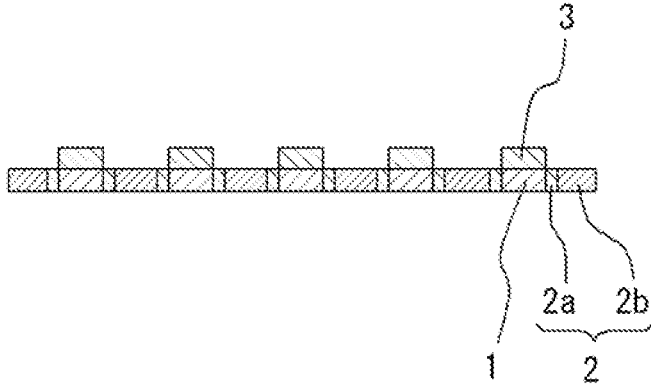
FIG. 7 is a schematic view for illustrating the manufacturing method of the optical member according to the first embodiment.

As illustrated in FIG. 7, the lower surface of the second light-transmissive member 3 including the upper surface, the lower surface, and the lateral surfaces is bonded to the upper surface of the first light-transmissive member 1. The second light-transmissive member 3 is, for example, ceramics.

An adhesive may be used for the bonding, but the bonding may be performed using surface activated bond (SAB) or atomic diffusion bond (ADB) without an adhesive. The use of the SAB or ADB allows bonding at room temperature, thus suppressing cracking of the first light-transmissive member 1 and the second light-transmissive member 3 due to heating and cooling. When the first light-transmissive member 1 and the second light-transmissive member 3 are bonded by the SAP or ADB, the surface roughness (Ra) of the upper surface of the first light-transmissive member 1 and the lower surface of the second light-transmissive member 3, which are bonding surfaces, can each be 10 nm or less, and is preferably 5 nm or less, more preferably 1 nm or less. When both the first light-transmissive member 1 and the second light-transmissive member 3 contain a phosphor, for example, the first light-transmissive member 1 may contain an LAG phosphor and the second light-transmissive member 3 may contain a Ca-$\alpha$ sialon phosphor.

Step of Forming Second Molded Body 4d

Figure 8:
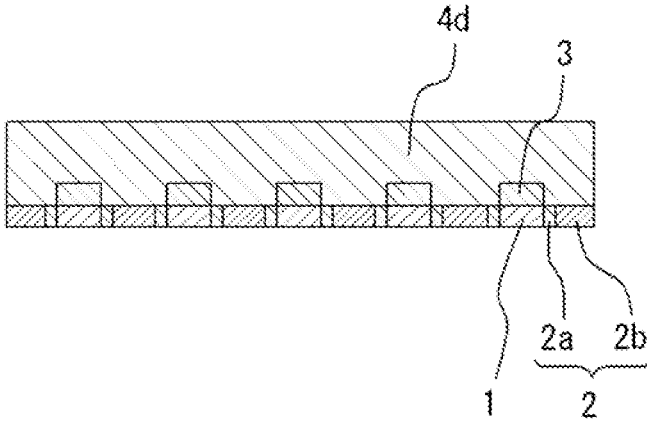
FIG. 8 is a schematic view for illustrating the manufacturing method of the optical member according to the first embodiment.

A second molded body 4d is formed, on the upper surface of the first light-reflective member 2, the second molded body 4d surrounding at least the lateral surfaces of the second light-transmissive member 3 and made of an inorganic material. As illustrated in FIG. 8, the second molded body 4d may be formed so as to surround the lateral surfaces and the upper surface of the second light-transmissive member 3.

The second molded body 4d can be molded using a slip casting method, a doctor blade method (sheet molding method), a dry molding method, a printing method, or the like.

In the present embodiment, the second molded body 4d is formed by a printing method. Specifically, first, ink including the second light reflecting powder is applied onto the second light-transmissive member 3 and the first light-reflective member 2 so as to cover the second light-transmissive member 3. The second molded body 4d can be formed by drying the ink. The ink includes, for example, the second light reflecting powder containing aluminum oxide and yttrium oxide, a dispersant, a binder, and pure water. Forming the second molded body 4d by the printing method is expected to improve mass productivity. When glass is used as a material of the second molded body 4d, the printing method is suitable.

Step of Producing Second Light-Reflective Member 4

The second molded body 4d is fired at the second temperature lower than the first temperature to produce the second light-reflective member 4 by which the lateral surfaces of the second light-transmissive member 3 is surrounded and from which the upper surface of the second light-transmissive member 3 is exposed.

A degreasing step of heating the second molded body 4*d* at a temperature lower than the second temperature may be performed before firing the second molded body 4*d* at the second temperature. The degreasing step can be performed, for example, in a nitrogen atmosphere or an air atmosphere.

Figure 9:
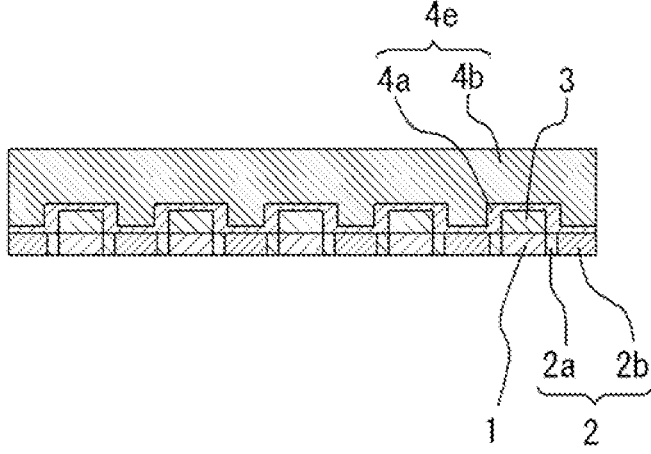
FIG. 9 is a schematic view for illustrating the manufacturing method of the optical member according to the first embodiment.

A second fired body 4*e* is produced by firing the second molded body 4*d* at the second temperature, as illustrated in FIG. 9. The second fired body 4*e* may include the third region 4*a* and the fourth region 4*b*. The firing temperature, the firing time, and the degree of pressure during firing may be adjusted to produce such a second fired body 4*e*. The second molded body 4*d* is preferably fired without being pressed. This makes it possible to produce, as a second composite body in which the second fired body 4*e*, the second light-transmissive member 3, the first light-reflective member 2, and the first light-transmissive member 1 are integrally formed, a second composite body including the second fired body 4*e* including the third region 4*a* and the fourth region 4*b* in order from the second light-transmissive member 3 side. It is assumed the reason why the third region 4*a* and the fourth region 4*b* are formed is that the presence of the second light-transmissive member 3 hinders bonding of the second light reflecting powders in the vicinity of the second light-transmissive member 3 and thus voids are likely to occur. For the same or similar reason, the third region 4*a* may also be formed in the vicinity of the first light-reflective member 2. As illustrated in FIG. 9, the third region 4*a* may be formed not only on the side of the second light-transmissive member 3, but also above the second light-transmissive member 3. Since there is no other member above the second light-transmissive member 3, the thickness of a portion of the third region 4*a* located above the second light-transmissive member 3 tends to be smaller than the width of a portion of the third region 4*a* located on the side of the second light-transmissive member 3. The width refers to the size in the direction parallel to the lower surface of the second light-transmissive member 3 (size in the horizontal direction in the drawing), and the thickness refers to the size in the direction perpendicular to the lower surface of the second light-transmissive member 3 (size in the vertical direction in the drawing). When the second fired body 4*e* is ceramics, the second fired body 4*e* may also be referred to as a second sintered compact. The second sintered compact is produced by sintering the second molded body 4*d* at the second temperature.

By firing the second molded body 4*d* at the second temperature lower than the first temperature, the width of the third region 4*a* may be greater than the width of the first region 2*a*. In this case, light from the second light-transmissive member 3 can be more efficiently reflected in the third region 4*a*. The width or thickness of the third region 4*a* may be different between a portion of the third region 4*a* in the vicinity of the second light-transmissive member 3 and a portion of the third region 4*a* in the vicinity of the first light-reflective member 2. For example, as illustrated in FIG. 9, the width of the portion of the third region 4*a* in the vicinity of the second light-transmissive member 3 may be greater than the thickness of the portion of the third region 4*a* in the vicinity of the first light-reflective member 2. When the first light-reflective member 2 includes voids to improve the reflectivity, the density of the second light-transmissive member 3 tends to be higher than the density of the first light-reflective member 2. Accordingly, the linear expansion coefficient of the second light-transmissive member 3 tends to be greater than the linear expansion coefficient of the first light-reflective member 2, so that the second light-transmissive member 3 is more expanded due to heat during firing and the bonding of the second light reflecting powders is more likely to be hindered in the vicinity of the second light-transmissive member 3. Therefore, it is assumed that the width of the portion of the third region 4*a* in the vicinity of the second light-transmissive member 3 is greater than the thickness of the portion of the third region 4*a* in the vicinity of the first light-reflective member 2. The width of the portion of the third region 4*a* in the vicinity of the second light-transmissive member 3 may be smaller than or the same as the thickness of the portion of the third region 4*a* in the vicinity of the first light-reflective member 2.

When aluminum oxide is used as the second light reflecting powder, the second temperature is preferably set in a range from 1200° C. to 1700° C., and more preferably set in a range from 1300° C. to 1500° C. When the second temperature is set to 1200° C. or higher, the strength of the second light-reflective member 4 produced can be ensured. When the second temperature is set to 1700° C. or lower, the growth of particles is suppressed, thereby reducing the possibility that the transmissivity of the second light-reflective member 4 increases due to an increase in density. Furthermore, when the first light-transmissive member 1 and/or the second light-transmissive member 3 contains a phosphor, degradation of the phosphor can be suppressed by setting the second temperature to 1700° C. or lower. The second temperature refers to the ambient temperature during firing.

In the present embodiment, firing is performed in the air atmosphere. The firing time can be set in a range from 30 minutes to 10 hours, for example, and is preferably set in a range from 3 hours to 6 hours. When the firing time is 30 minutes or more, the strength of the second light-reflective member 4 produced can be easily ensured. Furthermore, by setting the firing time to 10 hours or less, it is possible to avoid spending more time on firing than necessary.

The same material may be used for the first light reflecting powder and the second light reflecting powder. A material different from the material of the first light reflecting powder may be used as the material of the second light reflecting powder. When both the first light-reflective member 2 and the second light-reflective member 4 are ceramics, for example, the first light reflecting powder and the second light reflecting powder are made of the same material, and the first molded body 2*d* and the second molded body 4*d* are made of the same material. As a result, a difference between the first temperature and the second temperature can cause a difference in porosity between the produced first light-reflective member 2 and second light-reflective member 4. When ceramics is produced by the second molded body 4*d*, the second molded body 4*d* includes the second light reflecting powder made of an inorganic material. A material produced by the second molded body 4*d* may not be ceramics, and in such a case, the second molded body 4*d* may not include the second light reflecting powder made of an inorganic material.

The second light-reflective member 4 produced by firing the second molded body 4*d* may be glass containing a light scattering member. The light scattering member is, for example, a member having a refractive index different from a refractive index of a base material of the glass. The second light-reflective member 4 may be glass including bubbles. In this case, the bubbles may be referred to as the light scattering member. When the second light-reflective member 4 is glass, the firing can be performed at a lower temperature than when the second light-reflective member 4 is ceramics. As a result, when the second light-transmissive member 3 contains a phosphor, degradation of the phosphor can be suppressed and the luminous efficiency can be improved. Furthermore, since the firing can be performed at a relatively low temperature, the types of available phosphors are increased, which can further improve color rendering properties. Furthermore, warping of a composite produced can be reduced, which is advantageous during singulation. The glass used for the second light-reflective member 4 is preferably glass having a refractive index lower than the refractive index of a main material of the second light-transmissive member 3. This allows a part of light incident on the second light-reflective member 4 from the second light-transmissive member 3 to be totally reflected, thereby further improving the visibility of the light.

When the second light-reflective member 4 produced by firing the second molded body 4d is glass, the second temperature may be in a range from 500° C. to 1000° C. As the glass, borosilicate glass, for example, can be used.

Figure 10:
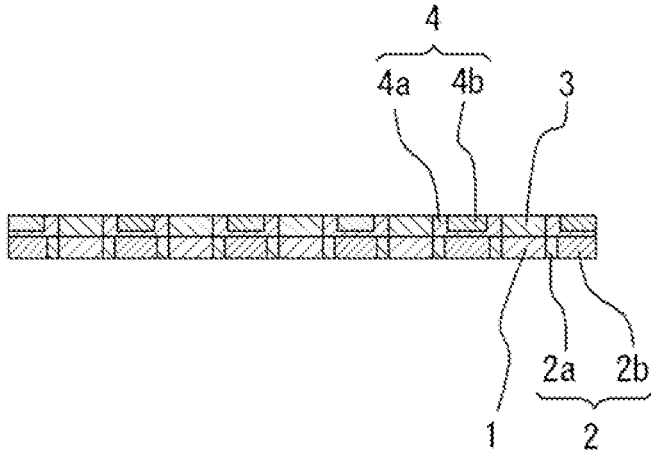
FIG. 10 is a schematic view for illustrating the manufacturing method of the optical member according to the first embodiment.

When the second fired body 4e surrounds the upper surface of the second light-transmissive member 3 as illustrated in FIG. 9, the upper surface of the second light-transmissive member 3 is exposed by removing a part of the second fired body 4e produced by firing the second molded body 4d. Thus, as illustrated in FIG. 10, the second light-reflective member 4 by which the lateral surfaces of the second light-transmissive member 3 is surrounded and from which the upper surface of the second light-transmissive member 3 is exposed is produced. When the second fired body 4e does not surround the upper surface of the second light-transmissive member 3, the second fired body 4e may be used as the second light-reflective member 4. Examples of the method of removing a part of the second fired body 4e include polishing or the like. In addition to removing a part of the second fired body 4e, the lower surfaces of the first light-transmissive member 1 and the first light-reflective member 2 may be polished.

Figure 11:
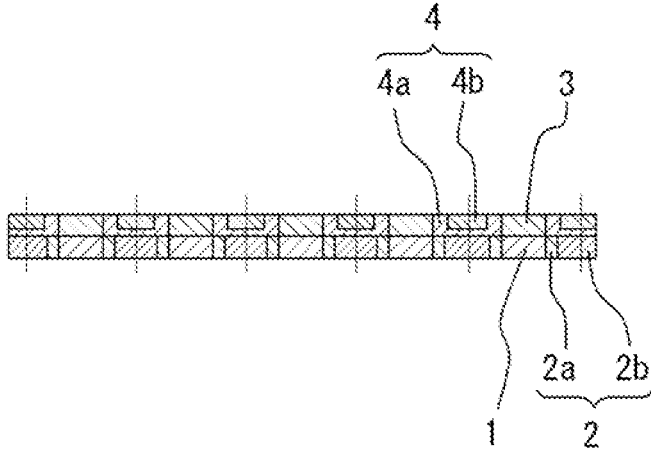
FIG. 11 is a schematic view for illustrating the manufacturing method of the optical member according to the first embodiment.

When a plurality of first light-transmissive members 1 and a plurality of second light-transmissive members 3 are disposed, singulation can be performed as illustrated in FIG. 11. A composite including the plurality of first light-transmissive members 1 and the plurality of second light-transmissive members 3 is singulated by dividing it into a plurality of optical members 10 so that one optical member 10 includes one first light-transmissive member 1 and one second light-transmissive member 3. The division is performed at the position of a vertical line in FIG. 11. The singulation may be performed so that one optical member 10 includes two or more first light-transmissive members 1 and two or more second light-transmissive members 3. For example, the composite can be singulated into the plurality of optical members 10 by using dicing. The singulation step may not be performed if unnecessary.

Second Embodiment

A manufacturing method of an optical member 10A according to a second embodiment is described with reference to FIGS. 12 to 17. Furthermore, the optical member 10A according to the second embodiment is described with reference to FIGS. 18A and 18B. FIGS. 12 to 17 are views for illustrating the manufacturing method of the optical member 10A according to the second embodiment. FIG. 18A is a schematic top view of the optical member 10A according to the second embodiment. FIG. 18B is a cross-sectional view taken along line XVIIIB-XVIIIB in FIG. 18A.

The manufacturing method of the optical member 10A of the second embodiment includes a step of preparing the first light-transmissive member 1 and the first molded body, a step of producing the first light-reflective member 2, a step of forming the second molded body, and a step of producing the second light-reflective member 4, and a step of forming the second light-transmissive member 3.

The manufacturing method of the optical member 10A of the second embodiment is different from the manufacturing method of the optical member 10 of the first embodiment in that the second light-reflective member 4 and the second light-transmissive member 3 is formed in the opposite order. The manufacturing method of the optical member 10A of the second embodiment is the same as the manufacturing method of the optical member 10 of the first embodiment in the step of producing the first light-reflective member 2.

The step of preparing the first light-transmissive member 1 and the first molded body includes preparing the first light-transmissive member 1 including the upper surface, the lower surface, and the one or more lateral surfaces, and the first molded body surrounding at least the one or more lateral surfaces of the first light-transmissive member 1 and made of an inorganic material. The step of producing the first light-reflective member 2 includes firing the first molded body at the first temperature to produce the first light-reflective member 2 by which the one or more lateral surfaces of the first light-transmissive member 1 is surrounded and from which the upper surface and the lower surface of the first light-transmissive member 1 are exposed. The step of forming the second molded body includes forming the second molded body made of an inorganic material on the upper surface of the first light-reflective member 2. The step of producing the second light-reflective member 4 includes firing the second molded body at the second temperature lower than the first temperature to produce the second light-reflective member 4 formed with an opening at which the upper surface of the first light-transmissive member 1 is exposed. The step of forming the second light-transmissive member 3 includes forming the second light-transmissive member 3 at the opening of the second light-reflective member 4.

Step of Forming Second Molded Body 4d

Figure 12:
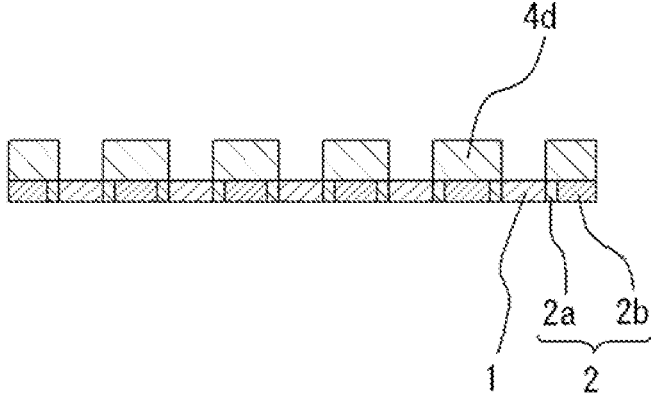
FIG. 12 is a schematic view for illustrating the manufacturing method of an optical member according to a second embodiment.

As illustrated in FIG. 12, the second molded body 4d made of an inorganic material is formed on the upper surface of the first light-reflective member 2. The second molded body 4d is formed while avoiding a place where the second light-transmissive member 3 is to be positioned. For example, the second molded body 4d is formed avoiding the upper surface of the first light-transmissive member 1. The second molded body 4d may also be formed avoiding a part of the upper surface of the first light-reflective member 2 that is continuous from the upper surface of the first light-transmissive member 1.

The second molded body 4d can be formed in a manner same as or similar to the step of forming the second molded body 4d in the first embodiment. For example, the second molded body 4d is formed by a printing method. The second molded body 4d patterned as illustrated in FIG. 12 can be easily produced by using the printing method.

Step of Producing Second Light-reflective Member 4

Figure 13:
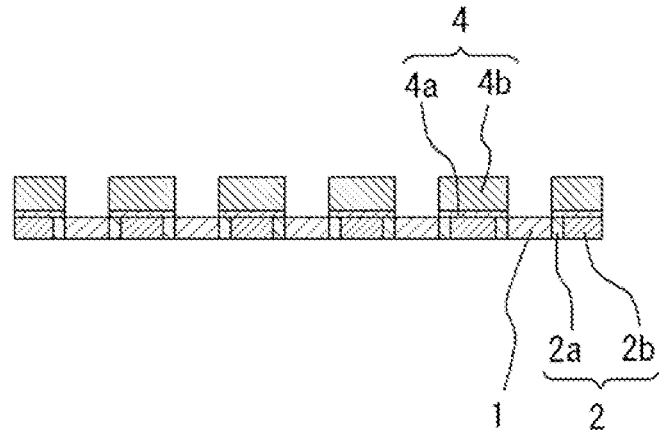
FIG. 13 is a schematic view for illustrating the manufacturing method of the optical member according to the second embodiment.

The second molded body 4d is fired at the second temperature lower than the first temperature to produce the second light-reflective member 4 formed with the opening at which the upper surface of the first light-transmissive member 1 is exposed as illustrated in FIG. 13. The entire upper surface of the first light-transmissive member 1 may be exposed, or only a part thereof may be exposed at the opening of the second light-reflective member 4. The entire upper surface of the first light-transmissive member 1 is exposed from the second light-reflective member 4, so that light from the upper surface of the first light-transmissive member 1 can be efficiently taken into the second light-transmissive member 3.

The firing of the second molded body 4*d* can be performed in a manner the same as or similar to the firing of the second molded body 4*d* in the first embodiment. A degreasing step of heating the second molded body 4*d* at a temperature lower than the second temperature may be performed before firing the second molded body 4*d* at the second temperature. A second fired body is produced by firing the second molded body 4*d*. The second fired body may be used as the second light-reflective member 4. The second light-reflective member 4 may be produced by, for example, polishing an upper surface of the second fired body. As illustrated in FIG. 13, the third region 4*a* of the second light-reflective member 4 may be formed in the vicinity of the first light-reflective member 2. Since the third region 4*a* is located in the vicinity of the first light-reflective member 2, light directed upward from the first light-reflective member 2 can be reflected in the third region 4*a*, which can improve the visibility of the light. When the second fired body is ceramics, the second fired body may also be referred to as a second sintered compact. The second sintered compact is produced by sintering the second molded body 4*d* at the second temperature.

Step of Forming Second Light-Transmissive
Member 3

The second light-transmissive member 3 is formed at the opening of the second light-reflective member 4. The second light-transmissive member 3 in the second embodiment may be made of the same material as the second light-transmissive member 3 in the first embodiment.

Figure 14:
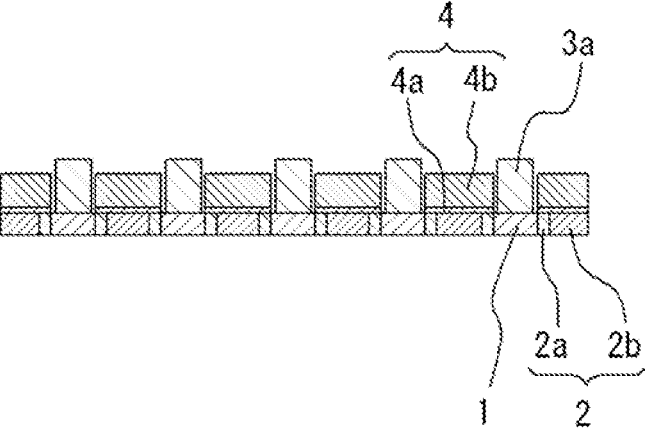
FIG. 14 is a schematic view for illustrating the manufacturing method of the optical member according to the second embodiment.
Figure 15:
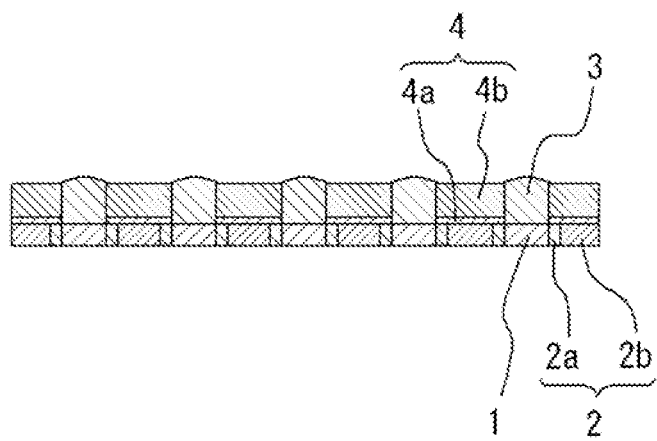
FIG. 15 is a schematic view for illustrating the manufacturing method of the optical member according to the second embodiment.

The second light-transmissive member 3 may be glass. In this case, the step of forming the second light-transmissive member 3 can include, for example, a step of disposing a glass 3*a* (a glass member) to be the second light-transmissive member 3 at the opening of the second light-reflective member 4 and a step of filling the opening by heating the glass 3*a*, as illustrated in FIG. 14. In this manner, as illustrated in FIG. 15, the second light-transmissive member 3 filled in the opening can be produced. The volume of the glass 3*a* is preferably greater than the volume of the opening of the second light-reflective member 4. In this manner, as illustrated in FIG. 15, the second light-transmissive member 3 can be more reliably filled in the opening. For example, by heating the glass 3*a* disposed at the opening while applying pressure to the glass 3*a*, the glass 3*a* is fused to the second light-reflective member 4. By using the fusion, the second light-transmissive member 3 can be fixed to the first light-transmissive member 1 and the second light-reflective member 4 at a temperature lower than the first temperature and the second temperature. When the second light-transmissive member 3 contains a phosphor, even a phosphor that degrades at the first temperature and the second temperature can be used.

Figure 16:
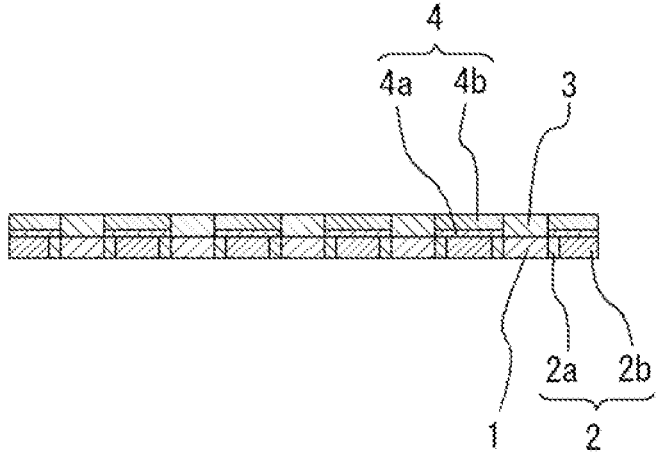
FIG. 16 is a schematic view for illustrating the manufacturing method of the optical member according to the second embodiment.

As illustrated in FIG. 16, a part of the second light-transmissive member 3 overflowing from the opening may be removed by polishing or the like.

The second light-transmissive member 3 may be formed by a printing method or a doctor blade method. In this case, the second light-transmissive member 3 may be ceramics such as aluminum oxide. When the second light-transmissive member 3 is ceramics, it is fired at a third temperature lower than both the first temperature and the second temperature. Since it is assumed that the ceramics fired at the third temperature has a relatively low density, it is preferable to reduce the thickness of the ceramics by polishing or the like after firing. This can improve light extraction efficiency. When the ceramics fired at the third temperature is used as the second light-transmissive member 3, since the density is relatively low, improvement in color unevenness and light distribution unevenness is expected. When the second light-transmissive member 3 is ceramics, the third fired body produced may be referred to as a third sintered compact. The third sintered compact is produced by sintering a third molded body provided at the opening at the third temperature.

Figure 17:
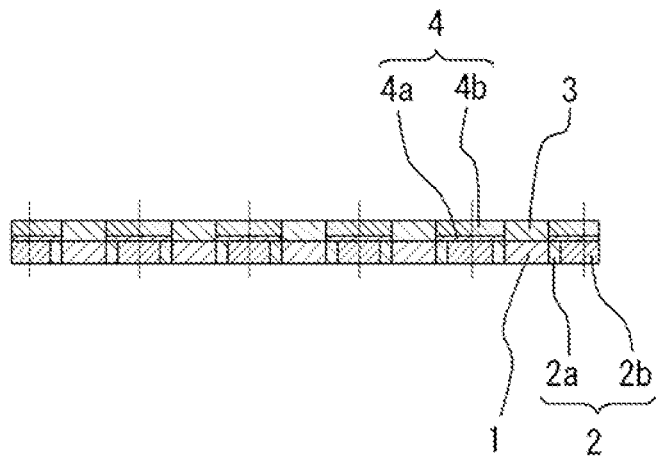
FIG. 17 is a schematic view for illustrating the manufacturing method of the optical member according to the second embodiment.
Figure 18A:
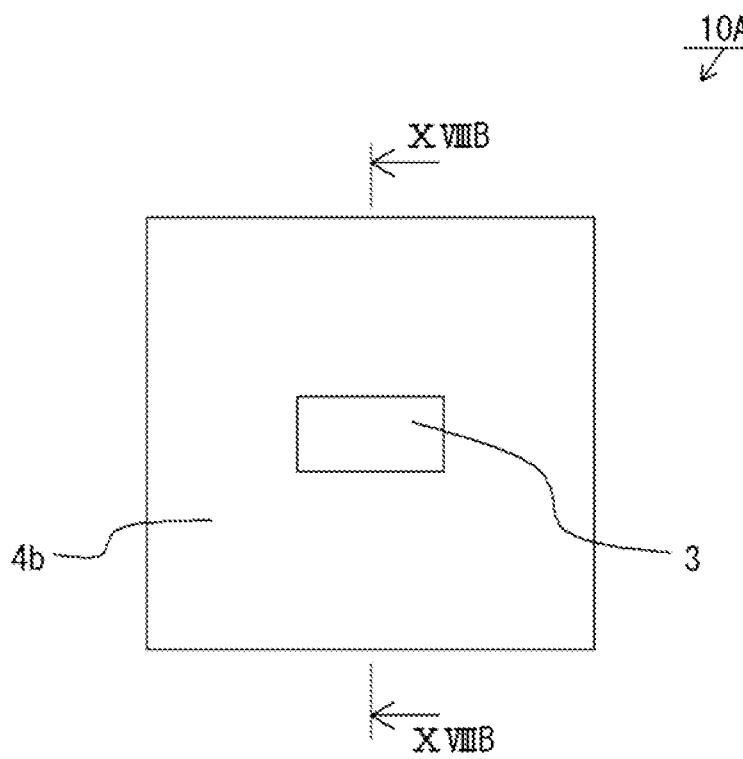
FIG. 18A is a schematic top view of the optical member according to the second embodiment.
Figure 18B:
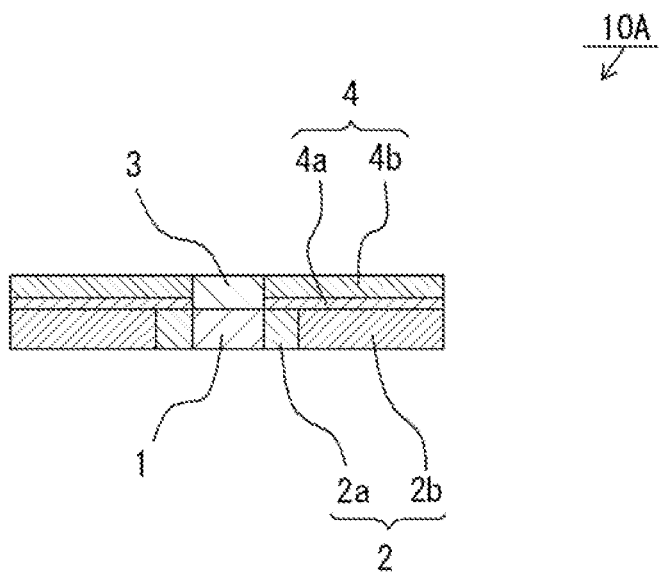
FIG. 18B is a cross-sectional view taken along line XVIIIB-XVIIIB in FIG. 18A.

As illustrated in FIG. 17, singulation is performed as necessary. Division and singulation are performed at the position of a vertical line in FIG. 17. As a result, the optical member 10A as illustrated in FIGS. 18A and 18B can be produced.

Third Embodiment

Figure 19:
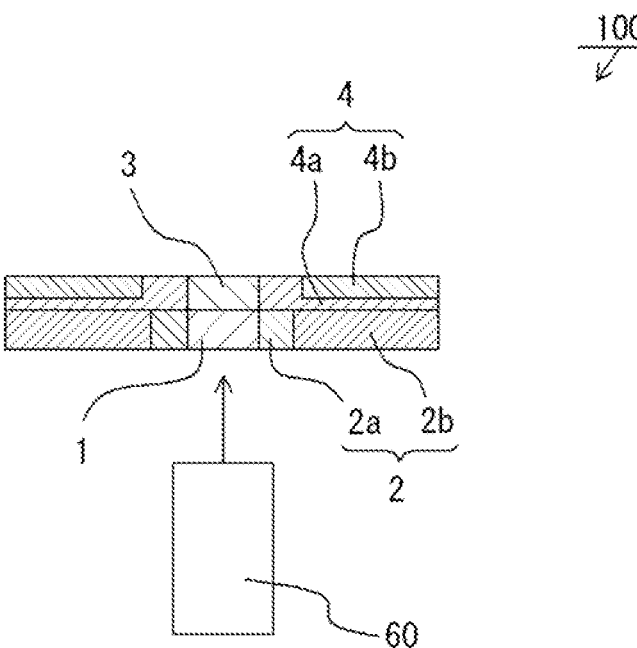
FIG. 19 is a schematic cross-sectional view of a light-emitting device according to a third embodiment.

A light-emitting device 100 according to a third embodiment is described with reference to FIG. 19. FIG. 19 is a schematic cross-sectional view of the light-emitting device 100 according to the third embodiment.

The light-emitting device 100*b* includes an optical member 10 and a light-emitting element 60. The light-emitting element 60 emits light incident on the first light-transmissive member 1 of the optical member 10. The optical member 10 is the optical member 10 of the first embodiment. The optical member 10 may be the optical member 10A of the second embodiment. Such a light-emitting device 100 can improve heat dissipation, and can improve the visibility of light. Light emitted by the light-emitting device 100 is, for example, visible light. Light emitted by the light-emitting device 100 is, for example, white light. The upper surface of the second light-transmissive member 3 can be used as a light extraction surface of the light-emitting device 100.

An example of the light-emitting element 60 includes, for example, a light-emitting diode (LED) or a laser diode (LD). The light-emitting element 60 is, for example, an LD. The light-emitting element 60 emits visible light, for example. The light-emitting element 60 emits blue light, for example. In the light-emitting device 100, the light-emitting element 60 and the optical member 10 are disposed so that light from the light-emitting element 60 passes through the first light-transmissive member 1 included in the optical member 10. As illustrated in FIG. 19, the light-emitting element 60 may be disposed at a position separated from the optical member 10. As a result, heat generated by the light-emitting element 60 and heat generated by the optical member 10 can be dissipated through separate paths.

The light-emitting element 60 may be in contact with the optical member 10. The light-emitting device 100 may include a plurality of optical members 10. The light-emitting device 100 may include an optical member 10 including a plurality of first light-transmissive members 1 and a plurality of second light-transmissive members 3.

A manufacturing method of the light-emitting device 100 includes a step of producing the optical member 10 and a step of disposing the optical member 10 and the light-emitting element 60 so that light emitted by the light-emitting element 60 is incident on the first light-transmissive member 1 of the optical member 10. In the step of producing the optical member 10, the manufacturing method of the optical member 10 in the first embodiment can be used. The manufacturing method of the optical member 10A in the second embodiment may be used for the step of producing the optical member 10. In this manner, the light-emitting device 100 provided with the optical member 10 including the first light-transmissive member 1, the second light-transmissive member 3, the first light-reflective member 2, and the second light-reflective member 4 can be easily produced.

Although the embodiments have been described above, the configurations described in the claims are not limited by these descriptions.

What is claimed is:

1. A method for manufacturing an optical member, the method comprising:

preparing a first light-transmissive member and a first molded body, the first light-transmissive member having an upper surface, a lower surface, and one or more lateral surfaces, and the first molded body being made of an inorganic material and surrounding at least the one or more lateral surfaces of the first light-transmissive member;

firing the first molded body at a first temperature to obtain a first light-reflective member so that the first light-reflective member surrounds the one or more lateral surfaces of the first light-transmissive member with the upper surface and the lower surface of the first light-transmissive member being exposed from the first light-reflective member;

bonding the upper surface of the first light-transmissive member to a lower surface of a second light-transmissive member, the second light-transmissive member having an upper surface, the lower surface, and one or more lateral surfaces;

forming, on an upper surface of the first light-reflective member, a second molded body surrounding at least the one or more lateral surfaces of the second light-transmissive member and made of an inorganic material; and firing the second molded body at a second temperature lower than the first temperature to obtain a second light-reflective member so that the second light-reflective member surrounds the one or more lateral surfaces of the second light-transmissive member with the upper surface of the second light-transmissive member being exposed from the second light-reflective member.

2. The method according to claim 1, wherein the forming of the second molded body includes forming the second molded body surrounding the one or more lateral surfaces and the upper surface of the second light-transmissive member, and the firing of the second molded body includes firing the second molded body at the second temperature to obtain a second fired body, and removing a part of the second fired body to expose the upper surface of the second light-transmissive member.

3. The method according to claim 1, wherein the first molded body contains a first light reflecting powder made of the inorganic material, and the second molded body contains a second light reflecting powder made of the inorganic material.

4. The method according to claim 1, wherein the first molded body contains aluminum oxide and yttrium oxide, and the second molded body contains aluminum oxide and yttrium oxide.

5. The method according to claim 1, wherein the preparing of the first light-transmissive member and the first molded body includes forming the first molded body surrounding the one or more lateral surfaces of the first light-transmissive member and at least one of the upper surface and the lower surface of the first light-transmissive member, and the firing of the first molded body includes firing the first molded body at the first temperature to obtain a first fired body, and removing a part of the first fired body to expose the upper surface and the lower surface of the first light-transmissive member to obtain the first light-reflective member.

6. The method according to claim 1, wherein the firing of the first molded body includes firing the first molded body without pressing.

7. The method according to claim 1, wherein the firing of the second molded body includes firing the second molded body without pressing.

8. The method according to claim 1, wherein the preparing of the first light-transmissive member and the first molded body includes forming the first molded body by a slip casting method.

9. The method according to claim 1, wherein the forming of the second molded body includes forming the second molded body by a printing method.

10. The method according to claim 1, wherein the first light-transmissive member contains a first phosphor and the second light-transmissive member contains a second phosphor different from the first phosphor.

11. A method for manufacturing an optical member, the method comprising:

preparing a first light-transmissive member and a first molded body, the first light-transmissive member having an upper surface, a lower surface, and one or more lateral surfaces, and the first molded body being made of an inorganic material and surrounding at least the one or more lateral surfaces of the first light-transmissive member;

firing the first molded body at a first temperature to obtain a first light-reflective member so that the first light-reflective member surrounds the one or more lateral surfaces of the first light-transmissive member with the upper surface and the lower surface of the first light-transmissive member being exposed from the first light-reflective member;

forming a second molded body made of an inorganic material on an upper surface of the first light-reflective member;

firing the second molded body at a second temperature lower than the first temperature to obtain a second light-reflective member defining an opening at which the upper surface of the first light-transmissive member is exposed; and forming a second light-transmissive member in the opening of the second light-reflective member.

12. The method according to claim 11, wherein the forming of the second light-transmissive member includes placing a glass member in the opening of the second light-reflective member, and heating the glass member to fill the opening with the glass member constituting the second light-transmissive member.

13. The method according to claim 11, wherein the first molded body contains a first light reflecting powder made of the inorganic material, and the second molded body contains a second light reflecting powder made of the inorganic material.

14. The method according to claim 11, wherein the first molded body contains aluminum oxide and yttrium oxide, and the second molded body contains aluminum oxide and yttrium oxide.

15. A method for manufacturing a light-emitting device, the method comprising:

manufacturing an optical member by the method according to claim 1; and positioning the optical member and a light-emitting element so that light emitted by the light-emitting element is incident on the first light-transmissive member of the optical member.

\* \* \* \* \*